(12) United States Patent
Schmidt et al.

(10) Patent No.: US 8,748,317 B2
(45) Date of Patent: Jun. 10, 2014

(54) METHOD OF MANUFACTURING A SEMICONDUCTOR DEVICE INCLUDING A DIELECTRIC STRUCTURE

(75) Inventors: Gerhard Schmidt, Wernberg (AT);
Daniel Schloegl, Villach (AT); Marcella Johanna Hartl, Drobollach (AT);
Philipp Sebastian Koch, Villach (AT);
Roland Strasser, Feld am See (AT)

(73) Assignee: Infineon Technologies Austria AG, Villach (AT)

( * ) Notice: Subject to any disclaimer, the term of this patent is extended or adjusted under 35 U.S.C. 154(b) by 123 days.

(21) Appl. No.: 13/566,192

(22) Filed: Aug. 3, 2012

(65) Prior Publication Data

US 2014/0038413 A1 Feb. 6, 2014

(51) Int. Cl.
*H01L 21/302* (2006.01)
*H01L 21/3105* (2006.01)
*H01L 21/321* (2006.01)
*H01L 21/02* (2006.01)
*H01L 21/304* (2006.01)
*B24B 37/04* (2012.01)

(52) U.S. Cl.
CPC ...... *H01L 21/31053* (2013.01); *H01L 21/3212* (2013.01); *H01L 21/02024* (2013.01); *H01L 21/304* (2013.01); *B24B 37/042* (2013.01)
USPC ................. 438/692; 216/52; 216/88

(58) Field of Classification Search
CPC ............ H01L 21/304; H01L 21/02024; H01L 21/31053; H01L 21/3212; B24B 1/00; B24B 37/042
USPC ...................... 216/52, 88; 438/692
See application file for complete search history.

(56) References Cited

U.S. PATENT DOCUMENTS

| | | | | |
|---|---|---|---|---|
| 5,970,374 A * | 10/1999 | Teo | ................................ | 438/629 |
| 6,249,039 B1 * | 6/2001 | Harvey et al. | ................. | 257/531 |
| 6,323,123 B1 * | 11/2001 | Liu et al. | ........................ | 438/638 |
| 2002/0168873 A1 * | 11/2002 | Ahn et al. | ...................... | 438/781 |
| 2003/0057414 A1 * | 3/2003 | Dalton et al. | ...................... | 257/3 |
| 2007/0207592 A1 * | 9/2007 | Lu et al. | ......................... | 438/455 |
| 2009/0014889 A1 * | 1/2009 | Barth et al. | ................... | 257/777 |
| 2012/0104537 A1 * | 5/2012 | Schmidt et al. | ............... | 257/476 |

OTHER PUBLICATIONS

L. Théolier, et al. "A new junction termination technique: the Deep Trench Termination (DT2)." 21st International Symposium on Power Semiconductor Devices & IC's, 2009. IEEE. pp. 176-179.
"Cure and Oxidation Measurements for Cyclotene Advanced Electronics Resins." The Dow Chemical Company. Midland, MI. pp. 1-4.
Kotb, et al. "Filling of very deep, wide ternches by BenzoCycloButene polymer." Microsystem Technologies, vol. 15, Issue 9. Springer-Verlag, 2009. pp. 1395-1400.

* cited by examiner

*Primary Examiner* — Shamim Ahmed
(74) *Attorney, Agent, or Firm* — Murphy, Bilak & Homiller, PLLC

(57) ABSTRACT

A dielectric layer is deposited on a working surface of a substrate, wherein the dielectric layer contains or consists of a dielectric polymer. The dielectric layer is partially cured. A portion of the partially cured dielectric layer is removed using a chemical mechanical polishing process. Then the curing of remnant portions of the partially cured dielectric layer is continued to form a dielectric structure. The partially cured dielectric layer shows high removal rates during chemical mechanical polishing. With remnant portions of the dielectric layer provided in cavities, high volume insulating structures can be provided in an efficient manner.

28 Claims, 8 Drawing Sheets

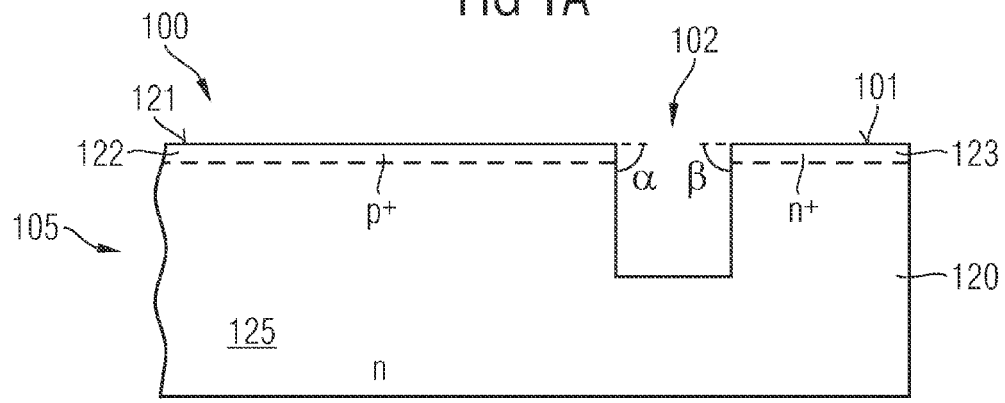
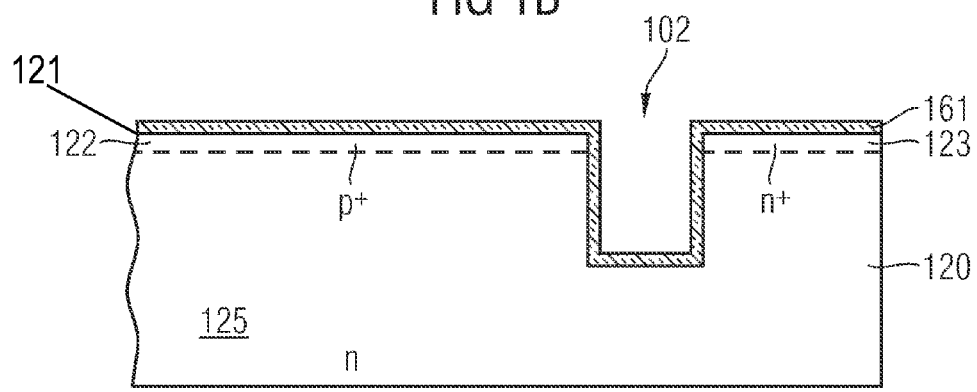
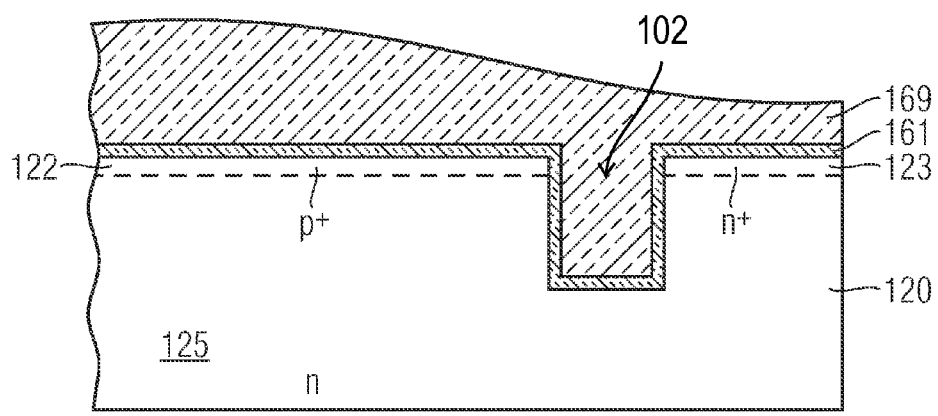

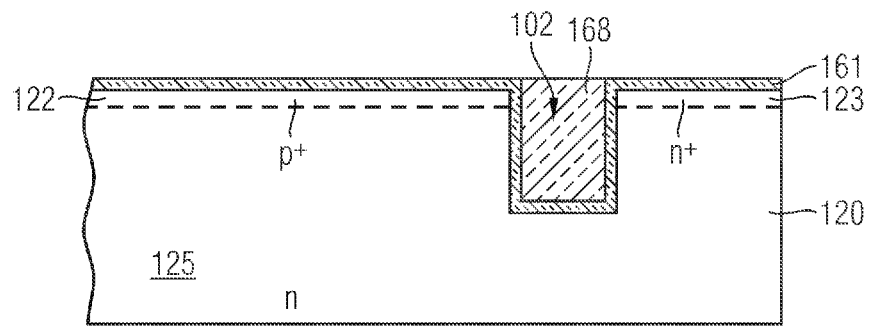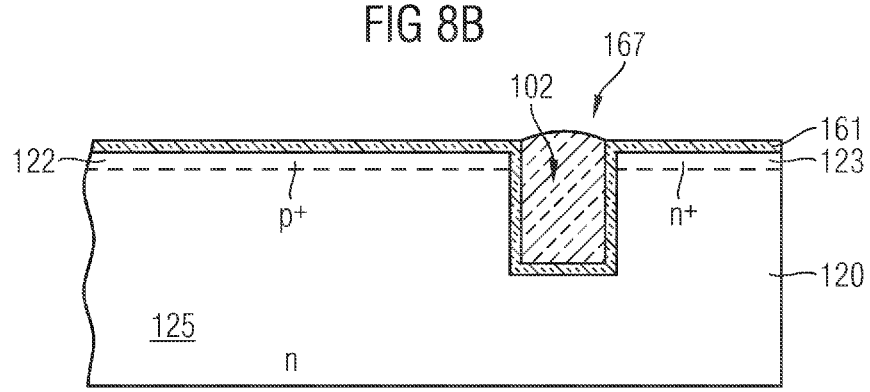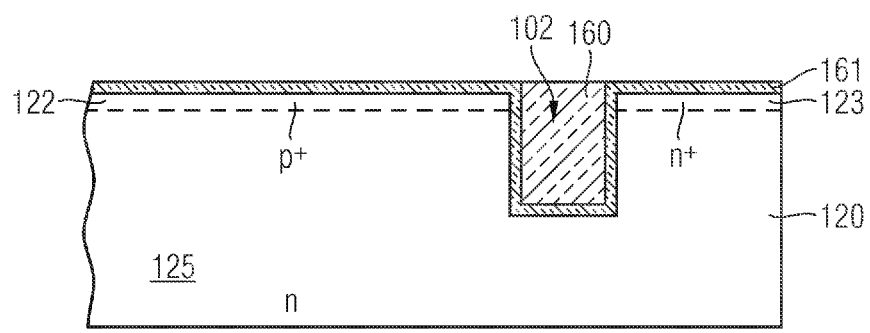

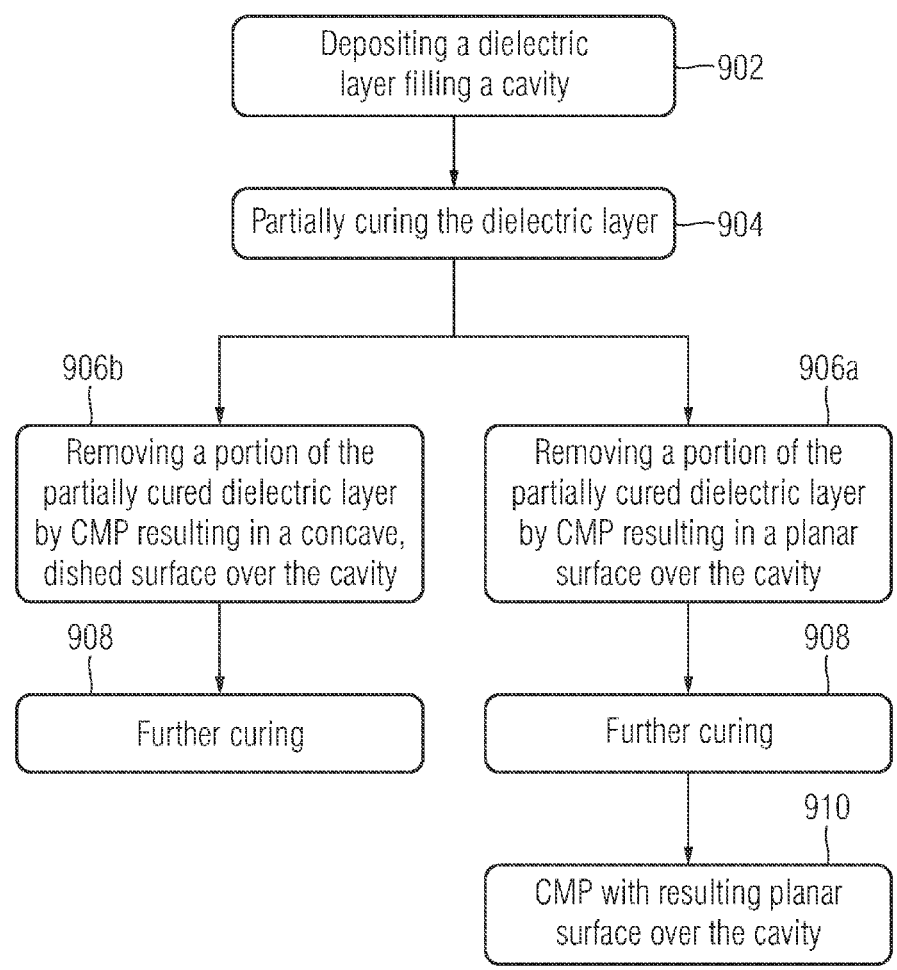

“METHOD OF MANUFACTURING A
SEMICONDUCTOR DEVICE INCLUDING A
DIELECTRIC STRUCTURE

BACKGROUND

Semiconductor devices include insulating structures extending into a semiconductor substrate. The insulating structures may be formed by etching cavities into the semiconductor substrate and filling the cavities with insulating materials like dielectric polymers. Conventional methods may be used to fill cavities up to a width of several micrometers.

It is desirable to provide a further method of providing semiconductor devices with dielectric structures.

SUMMARY

According to an embodiment referring to a method of manufacturing a semiconductor device, a dielectric layer is deposited on a working surface of a substrate, wherein the dielectric layer includes a dielectric polymer. The dielectric layer is partially cured. A portion of the partially cured dielectric layer is removed using a chemical mechanical polishing process. Remnant portions of the partially cured dielectric layer are further cured to form a dielectric structure.

According to another embodiment a cavity is formed that extends from a working surface into a substrate. A dielectric layer is deposited that fills the cavity. The dielectric layer includes a dielectric polymer. The dielectric layer is partially cured. A portion of the partially cured dielectric layer outside the cavity is removed using a chemical mechanical polishing process. Remnant portions of the partially cured dielectric layer are further cured to form a dielectric structure.

Those skilled in the art will recognize additional features and advantages upon reading the following detailed description, and on viewing the accompanying drawings.

BRIEF DESCRIPTION OF THE DRAWINGS

The accompanying drawings are included to provide a further understanding of the invention and are incorporated in and constitute part of the specification. The drawings illustrate the embodiments of the present invention and together with the description serve to explain principles of the invention. Other embodiments of the invention and intended advantages will be readily appreciated as they become better understood by reference to the following detailed description. The elements of the drawings are not necessarily to scale relative to each other. Like reference numerals designate corresponding similar parts.

FIG. 1A is a schematic cross-sectional view of a semiconductor substrate including a cavity for illustrating a method of manufacturing a semiconductor device according to an embodiment.

FIG. 1B is a schematic cross-sectional view of the semiconductor substrate of FIG. 1A after providing an auxiliary layer.

FIG. 1C is a schematic cross-sectional view of the semiconductor substrate of FIG. 1B after depositing a dielectric layer containing or consisting of a dielectric polymer.

FIG. 8A is a schematic cross-sectional view of a semiconductor substrate including a cavity for illustrating a method of manufacturing a semiconductor device according to an embodiment providing a multi-step polishing process after a first chemical mechanical polishing process.

FIG. 8B is a cross-sectional view of the semiconductor substrate of FIG. 8A after further curing the dielectric polymer of the polished partially cured dielectric layer.

FIG. 8C is a cross-sectional view of the semiconductor substrate of FIG. 8B after a further chemical mechanical polishing process.

FIG. 9B is a schematic flowchart providing an overview concerning alternatives for a polishing process according to further embodiments.

DETAILED DESCRIPTION

Figure 1D:
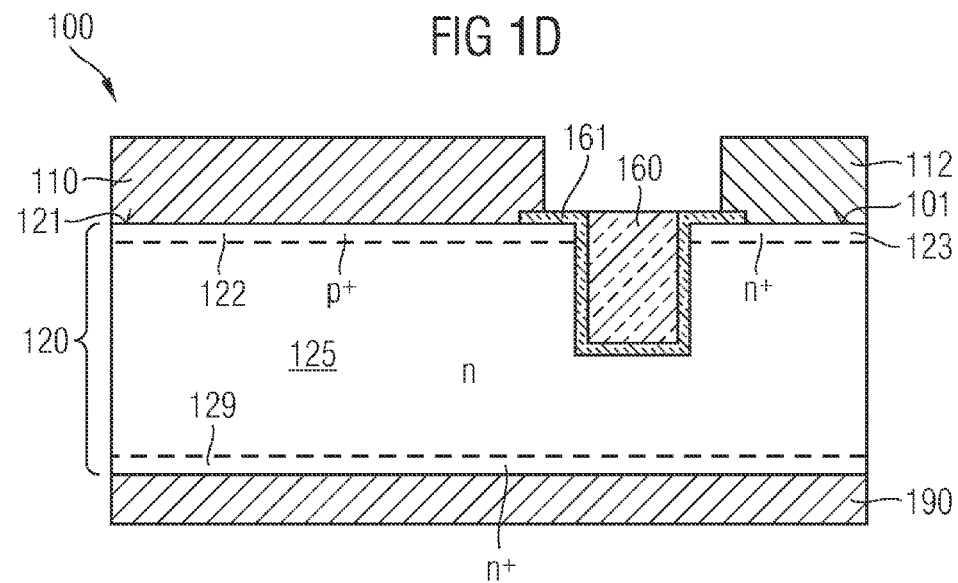
FIG. 1D is a cross-sectional view of the semiconductor substrate of FIG. 1C after chemical mechanical polishing of the dielectric layer, structuring the auxiliary layer, and providing metallization layers.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "having", "containing", "including", "comprising" and the like are open and the terms indicate the presence of stated elements or features but do not preclude additional elements or features. The articles "a", "an" and "the" are intended to include the plural as well as the singular, unless the context clearly indicates otherwise.

FIG. 1A shows a substrate 100 which includes a semiconductor substrate 120 in which at least portions of one semiconductor element 105 are formed. The semiconductor substrate 120 may be a pre-processed single-crystalline semiconductor substrate, for example a single-crystalline silicon wafer, a SiC, GaN, GaAs wafer or a silicon-on-insulator wafer. The semiconductor substrate 120 may include doped and undoped sections, epitaxial semiconductor layers and previously fabricated insulating structures. In the following, the semiconductor substrate 120 is referred to as a semiconductor substrate regardless of the presence of any non-semiconducting portions.

The semiconductor element 105 may be a diode or a transistor, for example a power field effect transistor or an IGBT (insulated gate bipolar transistor) formed from a plurality of transistor cells arranged in cell arrays, by way of example. The semiconductor substrate 120 may include further semiconductor elements 105 forming logic circuits, driver circuits, processor circuits or memory circuits. In the illustrated embodiment, the semiconductor element 105 is a diode with a highly p-doped anode region 122 and an n-doped central region 125. The substrate 100 may include further layers provided on a first surface 121 of the semiconductor substrate 120.

A photolithographic process may be used to pattern a hard mask, for example from TEOS (tetraethylorthosilane). Using the hard mask as an etch mask, at least one cavity 102 may be formed that extends from a working surface 101 of the substrate 100 into the substrate 100. According to an embodiment, the cavity 102 extends into the semiconductor substrate 120. Damages in the crystalline structure that are induced by the etch process may be cured by a thermal oxidation process forming a sacrificial oxide on the semiconductor substrate 120. Where the cavity is provided for forming an edge termination structure, acceptors may be implanted through the bottom and/or sidewalls of the cavity 102 and activated to increase the blocking capability in the edge area.

Other embodiments may provide the cavity 102 to extend from the working surface 101 of the substrate 100 into one or more layers provided above the first surface 121 of the semiconductor substrate 120. The cavity 102 may be formed between the working surface 101 of the substrate 100 and the first surface 121 of the semiconductor substrate 120 or may extend into the semiconductor substrate 120. For example, the substrate 100 includes the semiconductor substrate 120 and a further layer in first parts of the first surface 121 of the semiconductor substrate 120. The further layer may leave second parts of the first surface 121 uncovered to form one or more cavities 102.

The cavity 102 may have a width of at least 10 micrometers, for example at least 50 micrometers. According to an embodiment, the width of the cavity 102 is at least 60 micrometers. The depth of the cavity 102 may be at least 10 micrometers, for example at least 50 micrometers. According to an embodiment, the depth of the cavity 102 is at least 70 micrometers. According to another embodiment the cavity 102 may be a hole, wherein the opening of the hole may have an approximately circular or polygonal opening with or without rounded corners, e.g. a hexagonal, rectangular, or quadratic opening. According to another embodiment the cavity 102 is a groove-like structure having a length which is significantly greater than its width. Slope angles $\alpha$, $\beta$ between the sidewalls of the cavity 102 and the working surface 101 may have values between 0° and 180°, for example 60°. According to an embodiment, the slope angles $\alpha$, $\beta$ may be approximately 90°. According to a further embodiment, the cavity 102 is a circumferential groove and encircles the semiconductor element(s) formed in an element area in a mesa portion of the semiconductor substrate 120, wherein the mesa portion is assigned to a single semiconductor die. In a peripheral region of the chip area between the chip edge and the cavity 102 an $n^+$-doped field stop layer 123 may be provided.

According to other embodiments, the cavity 102 is formed in a kerf area of the substrate 100 where the substrate 100 is sawn or laser or plasma diced to obtain a plurality of semiconductor dies from the substrate 100.

FIG. 1B shows an auxiliary layer 161, which is deposited in a conformal manner on the working surface 101 including the cavity 102. The auxiliary layer 161 lines the cavity 102. The preconditioning of the semiconductor surface as well as the deposition of the auxiliary or passivation layer may be done in a way that ensures that the density of surface states becomes sufficiently small. The auxiliary layer 161 may be a diffusion barrier layer blocking the diffusion of ions into or out of the semiconductor substrate 120, or an adhesive layer supporting the adhesion of a material deposited in the following on the semiconductor substrate 120. The auxiliary layer 161 may also be effective as an etch or CMP (chemical mechanical polishing) stop layer in the following. According to an embodiment, the auxiliary layer 161 is a single layer or a layer stack and includes at least one of an amorphous diamond-like carbon layer, a silicon carbide layer, a silicon oxide layer and a silicon nitride layer. In the case where a layer deposited on or above the auxiliary layer 161 is photosensitive, the auxiliary layer 161 may act as an antireflective coating during an exposure of the layer. Embodiments related to a cavity 102 in layers above the first surface 121 of the semiconductor substrate 120 may also provide the auxiliary layer 161 to line the cavity 102.

As shown in FIG. 1C a dielectric layer 169 is deposited on the working surface 101, for example on the auxiliary layer 161. To ensure a good adhesion of the dielectric layer 169, the working surface 101 or the auxiliary layer 161 may be pretreated in an appropriate way. For example, an adhesion promoter may be deposited on the working surface 101 or on the auxiliary layer 161 in a preconditioning step. The deposited dielectric layer 169 fills the cavity 102. The dielectric layer 169 may include or consist of a dielectric polymer like benzocyclobutene, polynorbornene, polystyrene, polycarbonate, parylene, epoxy resin, silicon glass or silicone.

According to an embodiment, the dielectric layer 169 may include one or more of benzocyclobutene, polynorbornene, polystyrene or polycarbonate without any additives or containing one or more additives. According to other embodiments the dielectric layer 169 may contain, by way of example, silicon. According to an embodiment, the dielectric polymer contains benzocyclobutene BCB as a main constituent. BCB shows only low shrinkage ratios, is an effective moisture barrier and shows both high dielectric field strength and high thermal stability. For example, the dielectric polymer is one of the products distributed as Cyclotene™.

The dielectric layer 169 may be deposited using a printing process, for example screen printing, stencil printing or ink jet printing or by using a one-step or multi-step spin coating process. For a multi-step spin coating process, a first sublayer may be spin-coated and at least partially cured before a further sub-layer is spin-coated and partially cured.

A voidless and complete fill of the cavity 102 typically results in excess material deposited on the working surface 101. For example, for filling a circumferential cavity 102 having a width of about 60 micrometer and a depth of about 70 micrometer at a chip size of 5 mm×5 mm, some 20 to 30 micrometer excess material is deposited in the active chip area, wherein close to the chip edge area the fill of the cavity 102 reduces the thickness of the excess material.

At least a portion of the excess material of the deposited dielectric layer 169 is removed using a chemical mechanical polishing process, wherein the surface is planarized. According to an embodiment, the excess material is completely removed such that remnants of the dielectric layer 169 remain only within the cavity 102. According to another embodiment, the dielectric layer 169 is planarized and thinned to an insulator layer having a predetermined thickness. The insulator layer may electrically insulate conductive structures provided on the insulator layer and first conductive structures provided in the semiconductor substrate. Openings may be formed in the insulator layer to electrically connect conductive structures provided on the insulator layer and second conductive structures provided in the semiconductor substrate.

Typically organic dielectric polymers show only low polishing rates leading to long process times. For example, using a silica based slurry, benzocyclobutene completely cured at a temperature of 250° C. has a removal rate of 160-240 nm/min. As a consequence, removing 20-30 micrometers of excess material requires a process time of 1.5 to 2 hours. In addition, the polishing pad must be conditioned every 10 minutes, because the ablated material agglutinates to the polishing pad.

According to the embodiments, the dielectric layer 169 is only partially cured before the chemical mechanical polishing process is performed. According to an embodiment the partial curing provides a curing level of at least 40% and at most 70%. For example, the partial curing provides a curing level of at least 50%. According to another example, the partial curing provides a curing level of at most 60%. The inventors could show that for fully cured BCB, only weakly cured BCB, and totally uncured BCB, the CMP removal rates are rather low. In a small range between curing levels of 40% and 70%, the CMP removal rate is significantly increased, wherein a curing level of, for example, 50% indicates that 50% of the available cross-linkages are actually cross-linked.

The extent of the curing reaction may be monitored using infrared spectroscopy. For example, for Cyclotene™ polymers, the absorbance at a wavenumber of 1500 $cm^{-1}$ and at a wavenumber of 1475 $cm^{-1}$ can be evaluated to determine the curing level.

A portion of the partially cured dielectric layer 169 outside the cavity 102 is removed using a chemical mechanical polishing process. Since the removal rate for partially cured dielectric polymer is high, an excess layer of 20-30 micrometers may be removed within less than 3 minutes.

After the polishing, the remnant portions of the dielectric layer 169 within the cavity 102 may be further cured to a curing level of more than 80%, for example close to 100%. According to an embodiment, the remnant portions may be completely cured. Then a photolithographic process may be used to pattern the auxiliary layer 161, in particular, to remove the auxiliary layer 161 in regions where a metallization layer is provided to contact the substrate 100. The auxiliary layer 161 may be patterned using a plasma etch process. According to embodiments related to a cavity 102 in one or more layers above the first surface 121 of the semiconductor substrate 120, the remnant portions of the dielectric layer 169 fill the cavity 102 in the one or more layers between the working surface 101 of the substrate 100 and the first surface 121 of the semiconductor substrate 120.

Then a metallization layer may be provided on the front side of the substrate 100. The metallization layer may be patterned to form an anode metallization 110 and optionally an edge metallization 112. Between the anode electrode 110 and the edge construction 112, a circumferential insulating structure 160 is formed from the cured dielectric layer 169 in the cavity 102. A further dielectric layer may be provided above the working surface 101, for example from a polyimide. According to another embodiment, other cured portions of the dielectric layer 169 outside the cavity 102 may form the further dielectric layer. On the backside, the semiconductor substrate 120 may be thinned and a highly doped cathode layer 129 may be implanted after thinning. A backside metallization may be provided on the highly doped cathode layer 129. Finally, the semiconductor substrate 120 may be separated into single semiconductor devices by sawing, laser dicing or plasma dicing.

FIG. 1D shows a power diode resulting from the process as illustrated with FIGS. 1A to 1C. According to the illustrated embodiment, the semiconductor substrate 120 is n-doped silicon having a specific resistance of 53 Wcm at a thickness of 125 micrometer. A p-doped anode zone 122 has a penetration depth of about 6 micrometer and a surface doping concentration of $1 \times 10^{17}$ $cm^{-3}$. A channel stopper area 123 at the chip edge may be provided. According to an embodiment the channel stopper area 123 is a $p^+$-doped area which is electrically connected to the n-substrate. According to another embodiment, the channel stopper area 123 is $n^+$-doped. The channel stopper area 123 between the chip edge and the outer edge of the circumferential insulating structure 160 may have a surface doping concentration of $1 \times 10^{18}$ $cm^{-3}$ and a depth of about 6 micrometers. An $n^+$ cathode zone 129 on the backside of the semiconductor substrate 120 may have a doping concentration of $3.5 \times 10^{15}$ $cm^{-3}$ at a width of 2 micrometers. According to another embodiment a field stop zone may be provided directly adjoining to the cathode zone 129, having a maximal doping concentration of $1.3 \times 10^{14}$ $cm^{-3}$ and a width of 10 micrometer. The circumferential insulating structure 160 may have a width of 60 micrometers and a depth of 70 micrometers and is suited to block more than the volume breakdown voltage of about 1830 V in the reverse direction.

Figure 2:
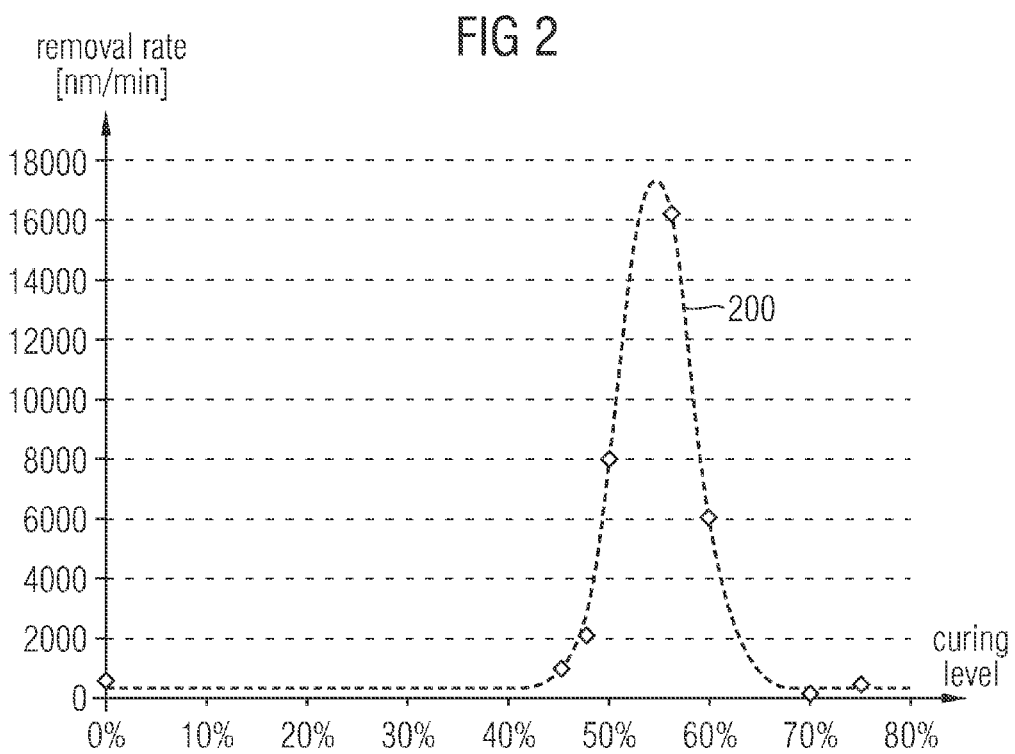
FIG. 2 is a schematic diagram illustrating a removal rate as a function of the curing level of a dielectric polymer.

The diagram in FIG. 2 gives the CMP removal rate in nanometers per minute as a function of the curing level of benzocyclobutene. The diamonds give the experimental results obtained by the inventor for curing levels at 0%, 45%, 48%, 50%, 55%, 60%, 70% and 75%. A Gaussian fit algorithm applied to the experimental results obtains the curve 200. According to the diagram, the CMP removal rate is low both for low curing levels below 40 and high curing levels of 70% and more. In a range of the curing level between about 45 and 65%, the CMP removal rate is significantly increased. The highest CMP removal rate can be obtained at curing levels of at least 50% and at most 60%. At a curing level of 55%, a CMP removal rate of 17 Micrometer/minute is observed. The curing level is the ratio between cross-linked molecules and the total number of available molecules. The CMP removal rate has been determined using a slurry based on Klebosol™ 30HB50 with a solids content of 30% and a ph-value of 2.5, at a down force of 8 psi, a table speed of 67 rpm and a carrier speed of 73 rpm.

Figure 3:
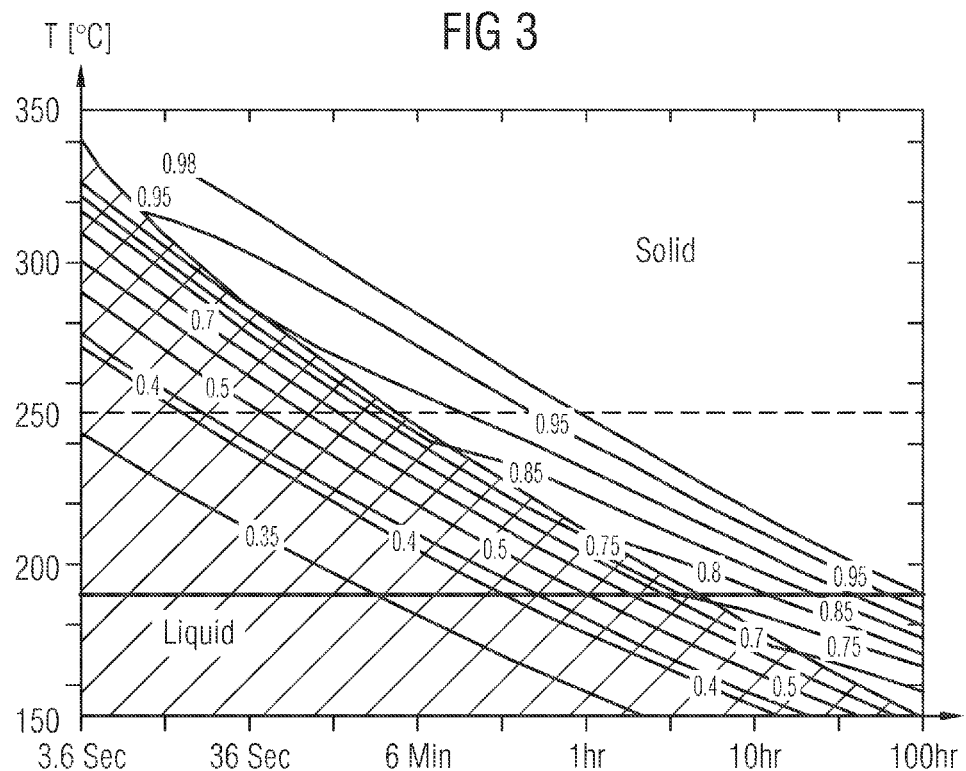
FIG. 3 is a schematic diagram illustrating the curing level as a function of a thermal budget.

FIG. 3 is a diagram giving the curing level as a function of the applied temperature in degree Celsius along the ordinate and the application time along the abscissa. For the experimental results shown in FIG. 2, the curing level was obtained using a temperature of 190° C. for an application time required for the desired curing level. For example, to obtain a curing level of about 50%, the semiconductor substrate was tempered at 190° C. for one hour.

Figure 4:
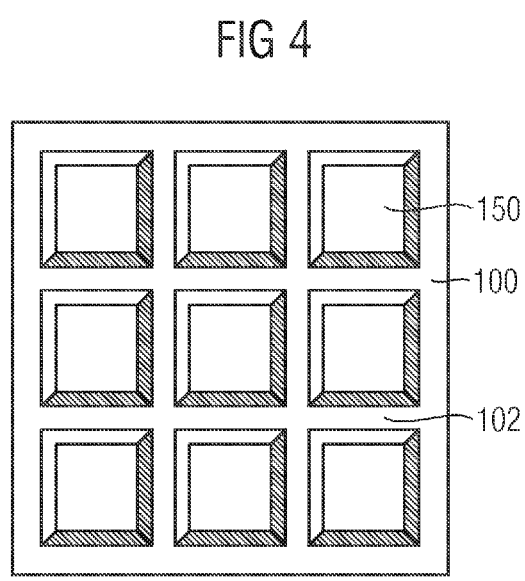
FIG. 4 is a schematic top view on a portion of a semiconductor substrate illustrating an embodiment referring to a grid-like cavity.

FIG. 4 refers to an embodiment where the cavity 102 forms a grid in the working surface of a substrate 100. The grid extends along kerf areas provided for separating semiconductor dies 150 formed from the same substrate 100. In the meshes of the grid, semiconductor elements 105 devices are formed in the semiconductor dies 150.

Figure 5:
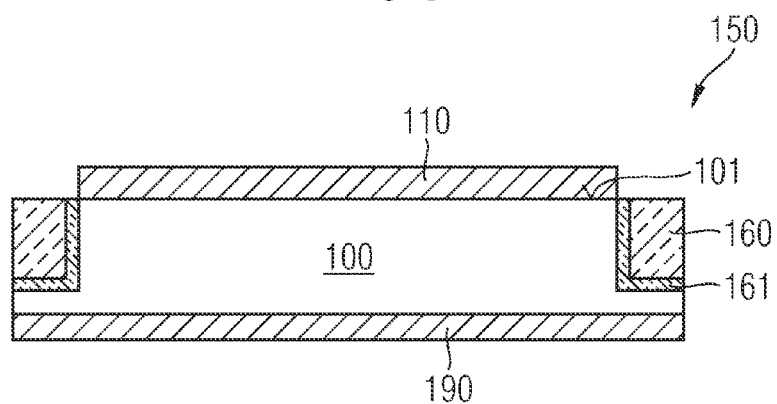
FIG. 5 is a schematic cross-sectional view of a semiconductor device obtained from the semiconductor substrate of FIG. 4.

FIG. 5 refers to a semiconductor die 150 resulting from singularizing the semiconductor dies 150 from the substrate 100 of FIG. 4. Along the edges of the semiconductor die 150 a circumferential insulating structure 160 encloses a central region of the semiconductor die 150 in which semiconductor elements are formed. A front side metallization 110 is formed on a working surface 101 of the substrate 100 of the semiconductor die 150 and a backside metallization 190 is formed at a surface on the opposite side of the working surface 101. An auxiliary layer 161, for example a diamond-like carbon layer, is formed between the substrate 100 and the circumferential insulating structure 160.

The circumferential insulating structure 160 forms an edge termination for reducing the electrical field strength at least partly in the vertical depth of the semiconductor die 150 such that chip space for a lateral edge termination is saved. According to the illustrated embodiment, the sidewall of the circumferential insulating structure 160 is parallel to the edge and perpendicular to the working surface 101. According to other embodiments, the sidewall may have a slope angle with respect to the working surface 101. The slope angle may be between 25 and 65 degrees, by way of example. While the embodiment illustrated in FIG. 5 relates to an insulating structure along the edge of the semiconductor die 150, other embodiments as illustrated in FIG. 1D provide the circumferential insulating structure 160 offset to the edge. According to other embodiments, the circumferential insulation structure may have a rounded shape in the chip corner in order to reduce the excess electrical field strength in this region.

Figure 6A:
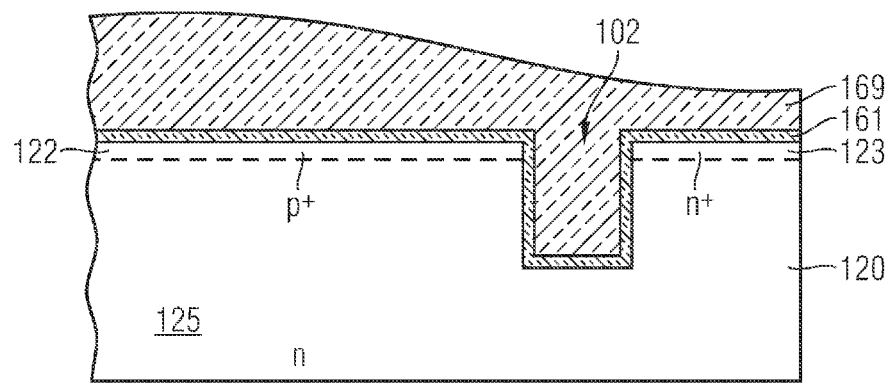
FIG. 6A is a schematic cross-sectional view of a semiconductor substrate including a cavity for illustrating a method of manufacturing a semiconductor device according to an embodiment providing a concavity, or "dishing," of the dielectric polymer before further curing.
Figure 6B:
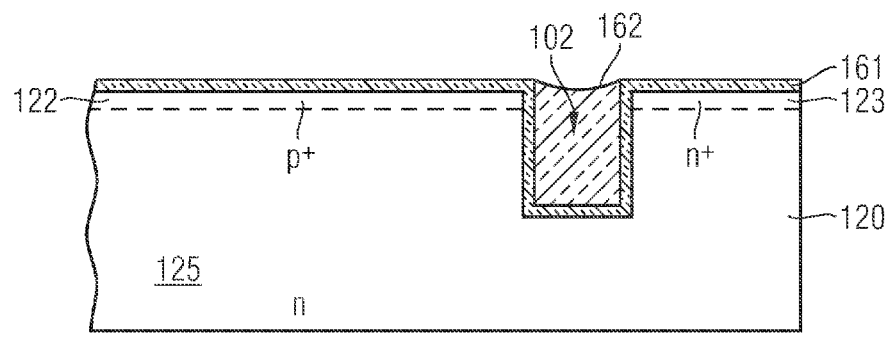
FIG. 6B is a schematic cross-sectional view of the semiconductor substrate of FIG. 6A after polishing.
Figure 6C:
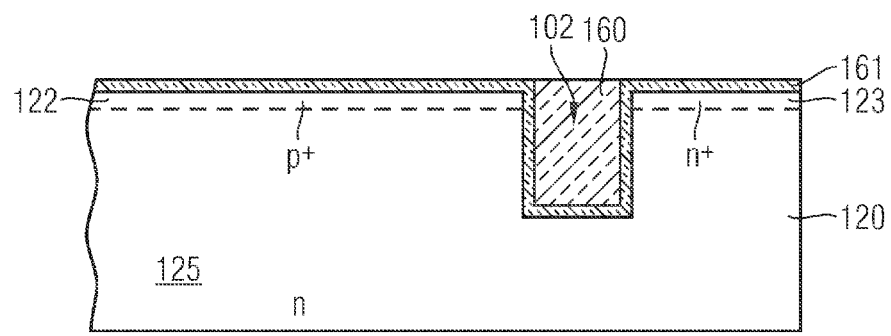
FIG. 6C is a cross-sectional view of the semiconductor substrate of FIG. 6B after further curing the dielectric polymer.

FIGS. 6A to 6C refer to an embodiment providing an overpolish of a partially cured dielectric layer 169. FIG. 6A shows a dielectric layer 169 deposited on an auxiliary layer 161 and filling a cavity 102 in a semiconductor substrate 120. The dielectric layer 169 is partially cured. The dielectric layer 169 may include or consist of a dielectric polymer like benzocyclobutene, polynorbornene, polystyrene, polycarbonate, parylene, epoxy resin, silicon glass or silicone. For example, the dielectric layer 169 may include one or more of benzocyclobutene, polynorbornene, polystyrene or polycarbonate without any additives or containing one or more additives. According to other embodiments the dielectric layer 169 may contain, by way of example, silicon. According to an embodiment, the dielectric polymer contains benzocyclobutene BCB as a main constituent.

The cavity 102 may be a circumferential cavity provided close to the chip edge of a semiconductor die formed in the semiconductor substrate 120 and may have a width of about 60 micrometers and a depth of about 70 micrometers at a chip size of 5 mm×5 mm. Some 20 to 30 micrometers of excess material is deposited in the active chip areas to reliably fill the cavities 102. Close to the chip edge areas the fill of the cavities 102 may locally reduce the thickness of the excess material.

A chemical mechanical polishing process is performed that completely removes the excess material outside the cavity 102 and which leaves remnant portions of the dielectric layer 169 within the cavity 102. The chemical mechanical polishing process over-polishes the dielectric polymer in the cavity 102 such that after the polishing process, the dielectric polymer in the cavity 102 has a dished or concave surface 162. The amount of the "dishing" (i.e., the degree of concavity of surface 162) is selected to compensate for an expansion of the remnant portions of the dielectric polymer in the cavity 102 during curing. The remnant portions of the dielectric layer within the cavity 102 are further cured.

FIG. 6C shows the semiconductor substrate after further curing. Since the amount of dishing has been selected to compensate for the expansion of the dielectric polymer during curing, the surface of an insulating structure 160 resulting from the further cured dielectric polymer in the cavity 102 is approximately flat and is approximately flush with the surface of the auxiliary layer 161.

Figure 7A:
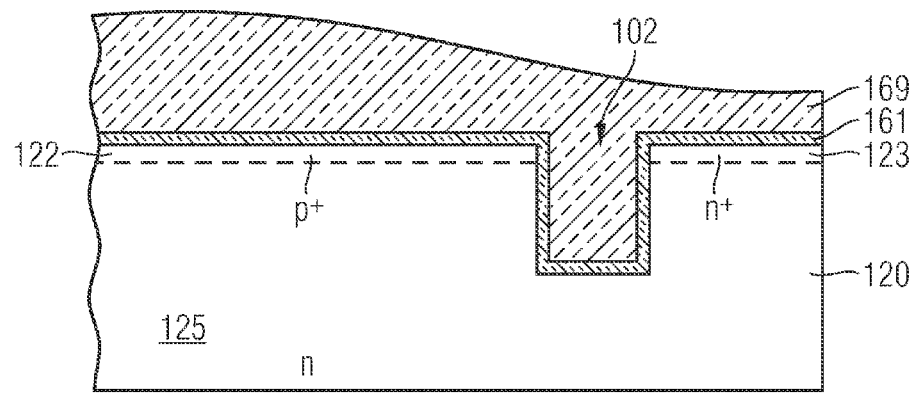
FIG. 7A is a schematic cross-sectional view of a semiconductor substrate including a cavity for illustrating a method of manufacturing a semiconductor device according to an embodiment providing a further chemical mechanical polishing process after further curing a dielectric polymer of a polished partially cured dielectric layer.
Figure 7B:
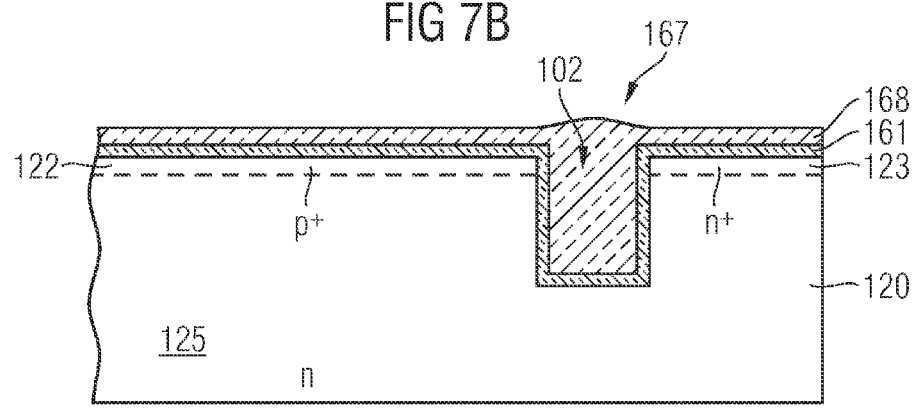
FIG. 7B is a cross-sectional view of the semiconductor substrate of FIG. 7A after further curing the dielectric polymer of the polished partially cured dielectric layer.
Figure 7C:
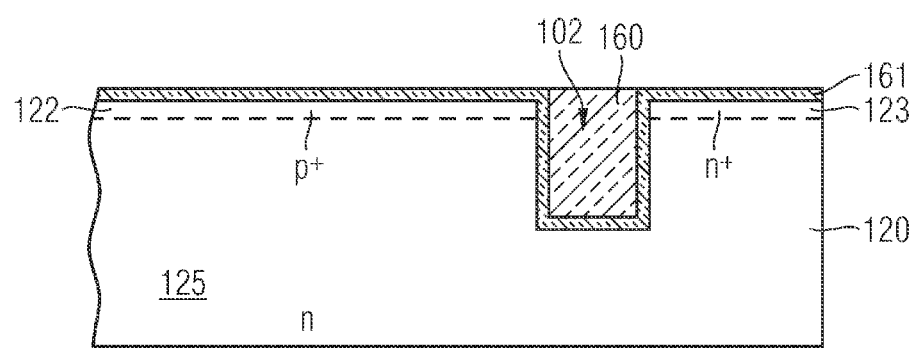
FIG. 7C is a cross-sectional view of the semiconductor substrate of FIG. 7B after polishing the further cured dielectric polymer.

FIGS. 7A to 7C refer to an embodiment providing more than one chemical mechanical polishing process. FIG. 7A corresponds to FIG. 6A. A first chemical mechanical polishing process is performed that may remove more than half of the excess material, for example at least 90%. According to an embodiment shown in FIG. 7B, the first polishing process is terminated at a thickness of a remaining excess material 168 of at least 0.5 micrometer, for example at least 1 micrometer and at most 2 micrometers. Then the dielectric polymer is further cured to a curing level of at least 90%, for example approximately 100%.

FIG. 7B shows the further cured remnant excess material 168. In active chip areas of the semiconductor substrate 120, the surface of the remnant excess material 168 is planarized. On the other hand, during the further curing, the dielectric polymer may expand such that protrusions 167 result in the remnant excess material 168 above the cavities 102. The protrusions 167 may have a convex or trapezoidal shape. At a depth of the cavities 102 of 70 micrometers, the height of the protrusions 167 may reach 5 micrometers.

The protrusions 167 disturb the planarity of a remnant insulating layer provided by the thinned excess material. As regards embodiments removing the excess material completely such that remnants of the dielectric layer 169 remain only within the cavities 102, the protrusions 167 hamper spin coating of a photoresist in a subsequent lithography process. The photoresist may accumulate near the protrusions 167 such that a non-uniform photoresist layer may result. Non-uniform photoresist layers may not be completely exposed in thick regions. Furthermore, the non-uniform photoresist layer may not be completely closed or may have portions which are too thin for subsequent processes, for example etching or ion implantation.

A further chemical mechanical polishing process is performed to level the protrusions 167. According to an embodiment, the further chemical mechanical polishing process may remove the excess material 168 completely such that the remnant dielectric polymer exclusively fills the cavities 102. According to another embodiment, the further chemical mechanical polishing process planarizes the excess material such that the excess material 168 forms a layer of uniform thickness.

The further chemical mechanical polishing process may start with a first down force and end at a second, different down force. According to an embodiment, the first down force may exceed the second down force by at least 25% of the second down force. For example, the first down force may be 8 psi and the second down force may be 6 psi or less, for example 4 psi or may have any other value between 4 and 6 psi.

Beginning from the start value, the down force may be continuously reduced towards the end of the further chemical mechanical polishing process and before the polishing reaches the auxiliary layer 161 or the semiconductor substrate 120. The further polishing process removes the protruding portions of the expanded dielectric polymer.

FIG. 7C shows the semiconductor substrate 120 and a resulting insulating structure 160 after the further polishing process. The surface of the insulating structure 160 is flat, and voids resulting from breaking off chunks from the dielectric polymer can be avoided.

The rotational speeds of the table and carrier may be held constant during the second chemical mechanical polishing process. According to other embodiments a first relative rotational speed between table and carrier may be used at the beginning of the further chemical mechanical polishing process and a second relative rotational speed, which deviates from the first relative rotational speed by at least 10 percent of the lower value, may be used at the end of the further chemical mechanical polishing process.

For example, higher relative rotational speeds between carrier and table at the end of the polishing process may reduce defect density and may enhance planarization. Other embodiments may provide time-variant rotational speeds for increasing selectivity against auxiliary layers provided from silicon nitride, silicon oxynitride or silicon oxide. Preston's Law gives the removal rate r as a function of the down force P, the relative rotational speed v between carrier and table, the Preston coefficient k and experimentally determined coefficients α, β according to equation (1):

$$r = k \cdot P^\alpha \cdot v^\beta \qquad (1)$$

For silicon nitride and silicon oxide, the coefficients α, β are approximately "1" indicating an approximately linear dependency of the removal rate from down force and relative rotational speed. On the other hand, the removal rate of dielectric polymers is influenced only to a low degree by the rotational speed. As a consequence, for dielectric polymers, such as BCB, the chemical erosion process dominates over the mechanical erosion process such that etch selectivity between dielectric polymers on the one hand, and silicon oxide as well as silicon nitride on the other hand, can be increased by reducing down force and the relative rotational speed between table and carrier.

FIGS. 8A to 8C refer to an embodiment with a first chemical mechanical polishing process completely removing portions of the dielectric layer 169 of FIG. 7A outside the cavity 102. The chemical mechanical polishing process may be a multi-step process with a first down force at the beginning and a second, different down force at the end of the polishing process, wherein the first down force may exceed the second down force by at least 25% of the second down force. The relative rotational speed between table and carrier at the beginning of the chemical mechanical polishing process may differ from the relative rotational speed at the end of the chemical mechanical polishing process by at least 10% of the lower value in order to improve etch selectivity.

FIG. 8A shows the remnant portions of the dielectric layer 168 of FIG. 7a within the cavity 102. The dielectric polymer is further cured, for example to a curing level of at least 90%, e.g. approximately 100%. The dielectric polymer may expand by several percent during the curing process.

FIG. 8B shows the expanded polymer in the cavity 102 forming a protrusion 167. A further chemical mechanical process is performed to level the protrusion 167.

FIG. 8C shows the leveled, further cured dielectric polymer forming an insulating structure 160 in the cavity 102.

Figure 9A:
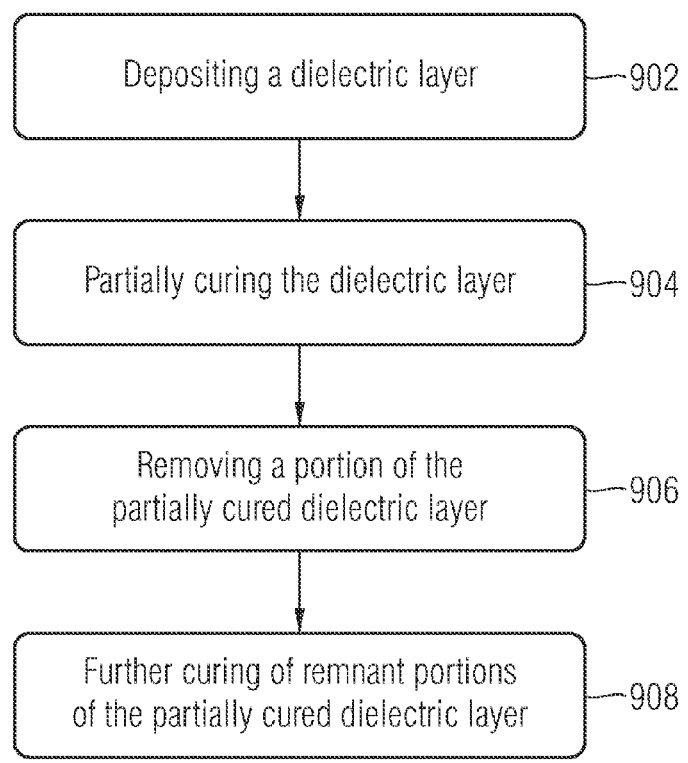
FIG. 9A is a schematic flowchart of a method of manufacturing a semiconductor device in accordance with another embodiment.

FIG. 9A refers to a method of manufacturing an integrated circuit. A dielectric layer containing or consisting of a polymer is provided on a working surface of a substrate (902). The dielectric layer is partially cured (904). A portion of the partially cured dielectric layer is removed by chemical mechanical polishing (906). The remnant portions of the partially cured dielectric layer are further cured (908). A cavity may be provided that extends from the working surface into the substrate before the dielectric layer is deposited, such that the remnant portions of the dielectric layer form an insulating structure in the cavity.

According to the method illustrated by the right hand branch of FIG. 9B, the partially cured dielectric layer is processed by a one or multi-step chemical mechanical polishing process (906a). The chemical mechanical polishing process may remove dielectric layer portions outside the cavity either completely or partially and may leave a flat surface of the dielectric layer. During further curing (908), the dielectric polymer may expand and may form a protrusion above the cavity which is removed in a further chemical mechanical polishing process (910) which can include a two-step processing for achieving a high removal rate at the beginning and high removal selectivity at the end of the further chemical mechanical polishing process.

The chemical mechanical polishing process (906b) of the method illustrated by the left hand branch of FIG. 9B removes the partially cured dielectric layer completely from outside the cavity and dishes the surface of the dielectric polymer within the cavity, resulting in a concave surface of the dielectric polymer filling the cavity. The amount of dishing (i.e., the degree, amount, or depth of the concavity) can be determined to compensate for an expansion of the dielectric polymer. During further curing (908), the dielectric polymer expands and the expansion material compensates for the dishing, thereby resulting, without additional polishing, in an approximately flat surface of an insulating structure formed by the dielectric polymer in the cavity after further curing.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising
   providing a cavity extending from a working surface into a substrate;
   providing a dielectric layer on the working surface, the dielectric layer including a dielectric polymer and filling the cavity;
   partially curing the dielectric layer;
   removing a portion of the partially cured dielectric layer using a chemical mechanical polishing process; and
   further curing remnant portions of the dielectric layer to form a dielectric structure.

2. The method according to claim 1, wherein remnant portions of the dielectric layer are formed in the cavity.

3. The method according to claim 1, wherein
   the cavity has a width of at least 10 micrometers.

4. The method according to claim 1, wherein
   the cavity is formed in a kerf area of the substrate.

5. The method according to claim 1, wherein
   the cavity is formed offset to a kerf area of the substrate.

6. The method according to claim 1, wherein
   the cavity is a circumferential cavity enclosing an element area of the substrate.

7. The method according to claim 1, further comprising providing, before depositing the dielectric layer, an auxiliary layer on the working surface.

8. The method according to claim 7, wherein the auxiliary layer is a single layer or a layer stack and comprises at least one layer provided from a material selected from a group containing amorphous diamond-like carbon, silicon carbide, silicon nitride, and silicon oxide.

9. The method according to claim 1, wherein the partially curing provides a curing level of at least 40 percent and at most 70 percent.

10. The method according to claim 1, wherein the partially curing provides a curing level of at least 50 percent.

11. The method according to claim 1, wherein the partially curing provides a curing level of at most 60 percent.

12. The method according to claim 1, wherein the polymer is benzocyclobutene.

13. The method according to claim 1, wherein the polymer contains Silicon.

14. The method according to claim 1, wherein an acidic slurry is used during the chemical mechanical polishing process.

15. The method according to claim 1, wherein the further curing of the remnant portions of the dielectric layer provides a curing level of at least 80%.

16. The method according to claim 1, wherein the dielectric polymer comprises an additive.

17. The method according to claim 1, wherein remnant portions of the dielectric layer are formed in the cavity and above the working surface.

18. The method according to claim 1, wherein the chemical mechanical polishing process removes a portion of the partially cured dielectric layer outside the cavity and leaves remnant portions of the dielectric layer within the cavity.

19. The method according to claim 18, wherein the chemical mechanical polishing process dishes a surface of the remnant portions of the dielectric layer within the cavity by an amount compensating for an expansion of the remnant portions in the cavity such that, after the further curing, the surface of the remnant portions of the dielectric layer within the cavity is flat.

20. The method according to claim 18, wherein a first down force applied at a beginning of the chemical mechanical polishing process exceeds a second down force applied at an end of the chemical mechanical polishing process by at least 25% of the second down force.

21. The method according to claim 18, wherein a first relative rotational speed is used between a table and a carrier at a beginning of the chemical mechanical polishing process and a second relative rotational speed, which deviates from the first rotational speed by at least 10 percent of the lower value, is used at an end of the chemical mechanical polishing process.

22. The method according to claim 18, comprising a further chemical mechanical polishing process after further curing the remnant portions of the dielectric layer.

23. The method according to claim 22, wherein a first down force applied at a beginning of the further chemical mechanical polishing process exceeds a second down force applied at and end of the further chemical mechanical polishing process by at least 25% of the second down force.

24. The method according to claim 22, wherein a first relative rotational speed is used between a table and a carrier at a beginning of the further chemical mechanical polishing process and a second relative rotational speed, which deviates from the first rotational speed by at least 10 percent of the lower value, is used at an end of the further chemical mechanical polishing process.

25. The method according to claim 1, wherein the substrate includes a semiconductor substrate.

26. A method of manufacturing a semiconductor device, the method comprising
providing a dielectric layer including a dielectric polymer on a working surface of a substrate;
partially curing the dielectric layer;
removing a portion of the partially cured dielectric layer using a chemical mechanical polishing process; and
further curing of remnant portions of the dielectric layer to form a dielectric structure.

27. The method according to claim 26, further comprising providing, before providing the dielectric layer, a cavity extending from the working surface into the substrate, wherein the remnant portions of the dielectric layer are formed in the cavity.

28. The method according to claim 26, further comprising providing, before providing the dielectric layer, a further layer in first parts of a first surface of a semiconductor substrate to form the substrate, wherein the remnant portions of the dielectric layer are formed in second parts of the first surface not covered by the further layer.

* * * * *

UNITED STATES PATENT AND TRADEMARK OFFICE
CERTIFICATE OF CORRECTION

| | | |
|---|---|---|
| PATENT NO. | : 8,748,317 B2 | Page 1 of 1 |
| APPLICATION NO. | : 13/566192 | |
| DATED | : June 10, 2014 | |
| INVENTOR(S) | : G. Schmidt et al. | |

It is certified that error appears in the above-identified patent and that said Letters Patent is hereby corrected as shown below:

In the Claims:

At column 12, line 16 (claim 23, line 4) of the printed patent, please change "and" to --an--.

Signed and Sealed this
Twenty-third Day of September, 2014

Michelle K. Lee
*Deputy Director of the United States Patent and Trademark Office*